(12) United States Patent
Hidese

(10) Patent No.: US 6,453,548 B1
(45) Date of Patent: Sep. 24, 2002

(54) ELECTRONIC COMPONENT MOUNTING METHOD

(75) Inventor: Wataru Hidese, Chikushino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/345,754

(22) Filed: Jul. 1, 1999

(30) Foreign Application Priority Data

Jul. 3, 1998 (JP) .......................................... 10-188405

(51) Int. Cl.[7] ................................................ H05K 3/30
(52) U.S. Cl. .............................. 29/832; 29/429; 29/430; 29/740; 29/741; 29/742; 29/784; 198/465.1; 198/465.3; 198/817
(58) Field of Search ...................... 89/429, 430, 740, 89/741, 742, 784, 832; 198/465.1, 465.3, 817

(56) References Cited

U.S. PATENT DOCUMENTS

| | | | | |
|---|---|---|---|---|
| 5,079,834 A | * | 1/1992 | Itagaki | 29/840 |
| 5,094,381 A | * | 3/1992 | Amos | 228/6.2 |
| 5,249,356 A | * | 10/1993 | Okuda | 29/833 |
| 5,377,405 A | * | 1/1995 | Sakurai | 29/833 |
| 5,541,834 A | * | 7/1996 | Tomigashi | 364/167.01 |
| 5,570,993 A | * | 11/1996 | Onodera | 414/783 |
| 5,724,722 A | * | 3/1998 | Hashimoto | 29/740 |
| 5,729,895 A | * | 3/1998 | Kim | 29/833 |
| 5,741,114 A | * | 4/1998 | Onodera | 414/783 |
| 5,823,316 A | * | 10/1998 | Shaw | 198/314 |
| 5,867,897 A | * | 2/1999 | Mimura | 29/840 |
| 6,012,222 A | * | 1/2000 | Asai | 29/832 |
| 6,094,808 A | * | 8/2000 | Mimura | 29/743 |
| 6,095,405 A | * | 8/2000 | Kim | 228/180.21 |
| 6,158,117 A | * | 12/2000 | Mimura | 29/833 |

FOREIGN PATENT DOCUMENTS

| | | | |
|---|---|---|---|
| JP | 06209194 | * | 7/1994 |
| JP | 09205297 | * | 8/1997 |
| JP | 11251789 | * | 9/1999 |
| WO | 97/20455 | | 6/1997 |

* cited by examiner

*Primary Examiner*—Peter Vo
*Assistant Examiner*—Paul Kim
(74) *Attorney, Agent, or Firm*—Wenderoth, Lind & Ponack, L.L.P.

(57) ABSTRACT

An upstream side first conveyor 5 and a downstream side second conveyor 6 are disposed in a mounting area A capable of mounting electronic components P by a transfer head 23. When mounting electronic components P on a large substrate 30A, the large substrate 30A is positioned on the first conveyor 5 and second conveyor 6 which are used as the mounting stage, and the electronic components P are mounted by the transfer head 23. When mounting electronic components on small substrates, the second conveyor 6 is used as the mounting stage, and the small substrate is positioned, and electronic components P are mounted by the transfer head 23, while the first conveyor 5 is used as a waiting stage, and next small substrate is waiting thereon, so that efficient mounting depending on the size of substrates may be realized.

5 Claims, 19 Drawing Sheets

ELECTRONIC COMPONENT MOUNTING METHOD

FIELD OF THE INVENTION

The present invention relates to an electronic component mounting apparatus and an electronic component mounting method for mounting electronic components on a substrate.

BACKGROUND OF THE INVENTION

An electronic component mounting apparatus is designed to position a substrate on a conveyor in a positioning unit, move a transfer head horizontally by a moving table, and mount an electronic component at a position of specified coordinates on the substrate. The substrate varies in size, ranging from several centimeters or less to more than ten centimeters in the length of one side. Hitherto, the conveyor in the positioning unit was assembled with a longer size so as to be applicable to large substrates.

Generally, while mounting an electronic component with a transfer head on a substrate positioned on a conveyor in a positioning unit, a next substrate on which an electronic component is to be mounted is waiting at a waiting stage on a delivery conveyor provided at an upstream side of this conveyor. After finishing mounting of the electronic component on the substrate on the conveyor in the positioning unit, the substrate after mounting is sent out to a discharge conveyor, and the next substrate is sent onto the conveyor in the positioning unit from the delivery conveyor, and it is positioned therein, and mounting of electronic component by the transfer head is started.

Therefore, conventionally, since the conveyor in the positioning unit was assembled with a large size so as to be applicable to large substrates, in the case of small substrates, it took a long feed distance and time to send small substrates from the waiting stage onto the conveyor in the positioning unit, and the working efficiency was poor.

SUMMARY OF THE INVENTION

It is hence an object of the invention to present an electronic component mounting apparatus and an electronic component mounting method capable of mounting electronic components by efficiently feeding substrates into the positioning unit depending on the size of the substrates.

To achieve the object, the invention provides an electronic component mounting apparatus comprising a transfer head for mounting an electronic component on a substrate, a moving table for moving the transfer head horizontally, and a substrate positioning unit provided in a mounting area of electronic components capable of moving the transfer head horizontally, in which a plurality of conveyors for conveying the substrate are disposed independently of each other in the substrate positioning unit, substrate receiving means are independently disposed, respectively, beneath these conveyors, a substrate delivery conveyor is disposed at an upstream side of the plurality of conveyors, and a substrate discharge conveyor is disposed at a downstream side.

Preferably, moreover, a first substrate stopper is provided among the plurality of conveyors so as to be free to move in and out at the substrate conveying side, and a second substrate stopper is provided at a rear part of the downstream side conveyor so as to be free to move in and out at the substrate conveying side.

The invention also provides an electronic component mounting method for mounting an electronic component on a substrate by a transfer head moving horizontally as being driven by a moving table, in which a plurality of conveyors are disposed independently of each other in a mounting area of electronic components capable of moving the transfer head horizontally, and when mounting an electronic component on a large substrate, the plurality of conveyors are used as the mounting stage, and the large substrate is positioned over the plurality of conveyors, and the electronic component is mounted by the transfer head, or when mounting an electronic component on a small substrate, a single conveyor at the downstream side is used as the mounting stage for positioning the small substrate, and the electronic component is mounted by the transfer head, while another single conveyor at the upstream side is used as the waiting stage on which a next small substrate is waiting.

In this constitution, in the case of a large substrate, the plurality of conveyors are used as the mounting stage of electronic component. In the case of a small substrate, one single conveyor is used as the mounting stage of electronic component, while the other single conveyor is used as waiting stage for next small substrate. When the mounting of electronic component on the small substrate on one single conveyor is finished and this small substrate is sent out to the discharge conveyor, the next small substrate is sent promptly from the other single conveyor onto the one single conveyor, and mounting of electronic components is started.

DETAILED DESCRIPTION OF THE INVENTION

Figure 1:
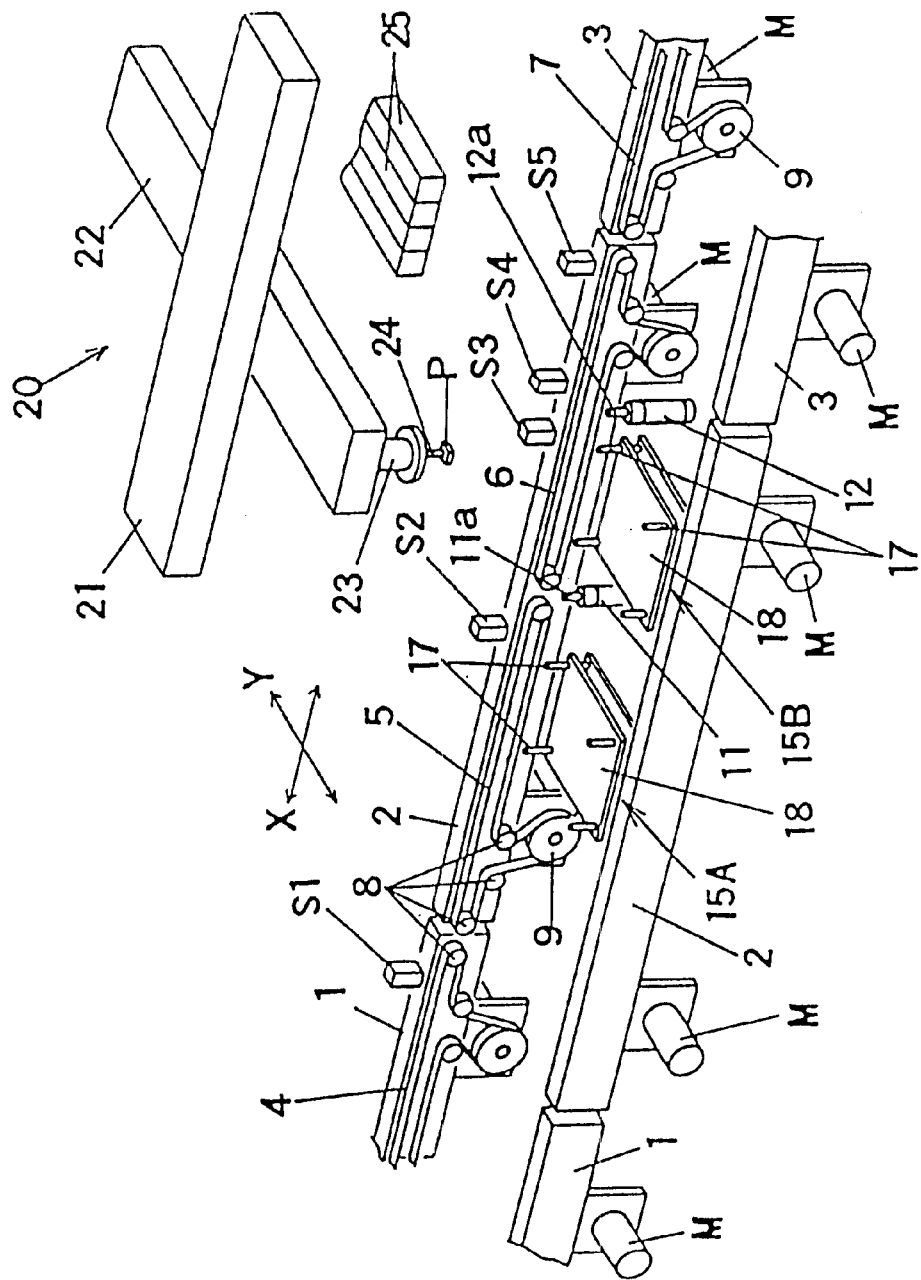
FIG. 1 is a perspective view of an embodiment of an electronic component mounting apparatus of the invention.

Referring now to the drawings, an embodiment of the invention is described in detail below. FIG. 1 is a perspective view of an embodiment of an electronic component mounting apparatus of the invention, and FIG. 2 through FIG. 19 are side views of its operating state.

First referring to FIG. 1, a general structure of the electronic component mounting apparatus is described. Reference numerals 1, 2 and 3 are long plate frames disposed linearly in the X-direction, each consisting of a pair of right and left sides, and conveyors 4, 5, 6, 7 are provided in their inside. The conveyors 4 to 7 are belt conveyors, and each conveyor belt is driven by a motor M, and rotates along a small pulley 8 and a large pulley 9 to convey a substrate in the X-direction. In this invention, the substrate conveying direction is supposed to be the X-direction, and its orthogonal direction is the Y-direction.

The conveyor 4 installed on the upstream frame 1 is a delivery conveyor, and the conveyor 7 installed on the downstream frame 3 is a discharge conveyor. On the middle frame 2, a plurality of (two, in this embodiment) conveyors 5, 6 are disposed independently of each other. Herein, the upstream side conveyor 5 is called the first conveyor, and the downstream side conveyor 6 is called the second conveyor. The middle frame 2, and the first conveyor 5 and second conveyor 6 installed thereon constitute a positioning unit for positioning a substrate on a mounting area of electronic components.

Figure 2:
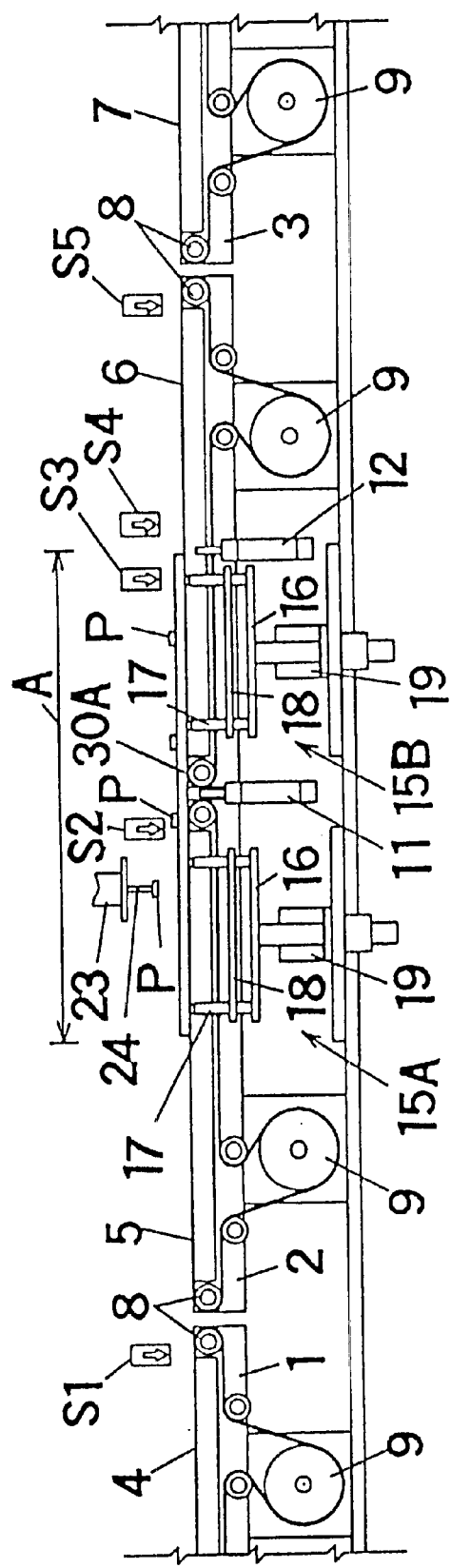
FIG. 2 is a side view of its operating state.

In FIG. 1 and FIG. 2, a first substrate stopper 11 is provided between the first conveyor 5 and second conveyor 6, and a second substrate stopper 12 is provided in the middle of the second conveyor 6. The first substrate stopper 11 and second substrate stopper 12 are cylinders, and by moving in and out their rods 11*a*, 12*a* from beneath to the conveying surface of the substrate conveyed by the first conveyor 5 or second conveyor 6, the substrate is stopped at a specified position.

A first sensor S1 is disposed at the downstream side end of the delivery conveyor 4. A second sensor S2 is disposed at the downstream side end of the first conveyor 5. A third sensor S3 and a fourth sensor S4 are disposed before and after the second stopper 12. A fifth sensor S5 is disposed at the downstream side end of the second conveyor 6. These sensors S1 to S5 detect the substrate.

First substrate receiving means 15A is disposed beneath the downstream side of the first conveyor 5. Second substrate receiving means 15B is disposed beneath the upstream side of the second conveyor 6. The first substrate receiving means 15A and second substrate receiving means 15B are of identical structure, and are disposed independently of each other.

The structure is described below. In FIG. 1 and FIG. 2, a substrate receiving pin 17 is set up on a support plate 16. Reference numeral 18 is a tipping preventive plate of the pin 17 provided on the support plate 16 in which the pin 17 is inserted, and 19 is a cylinder as vertical moving means for supporting the support plate 16 from beneath and moving the support plate 16 and pin 17 vertically. When mounting an electronic component on a substrate, the pin 17 is elevated to support the substrate from beneath. When conveying the substrate by the first conveyor 5 or second conveyor 6, it is set aside beneath so as not to interfere with the conveyance.

In FIG. 1, reference numeral 20 is a moving table, which is composed of an X-table 21 and a Y-table 22 mutually crossing orthogonally. A transfer head 23 is mounted on the Y-table 22. The transfer head 23 is driven by the moving table 20, and is moved horizontally in the X-direction or Y-direction, and an electronic component P provided in a parts feeder 25 is suctioned and picked up with a vacuum by a lower end of a nozzle 24, and is mounted on the position of specified coordinates of the substrate positioned in the positioning unit. In FIG. 2, symbol A denotes a mounting area of the transfer head 23 in the range of X-direction. The mounting area A spreads over the first conveyor 5 and second conveyor 6. In the embodiment, mutually independent two conveyors 5, 6 are disposed in the mounting area A, but three or more conveyors may be also disposed. However, if three or more conveyors are disposed, the operation control is complicated, and it is preferred to dispose two conveyors as in this embodiment.

This electronic component mounting apparatus is thus constituted, and the method of operation in the case of large substrates is described in the first place. FIG. 2 to FIG. 7 show the operation in the sequence of steps. Large substrates are identified as 30A, 30B and 30C in the sequence of mounting.

Figure 3:
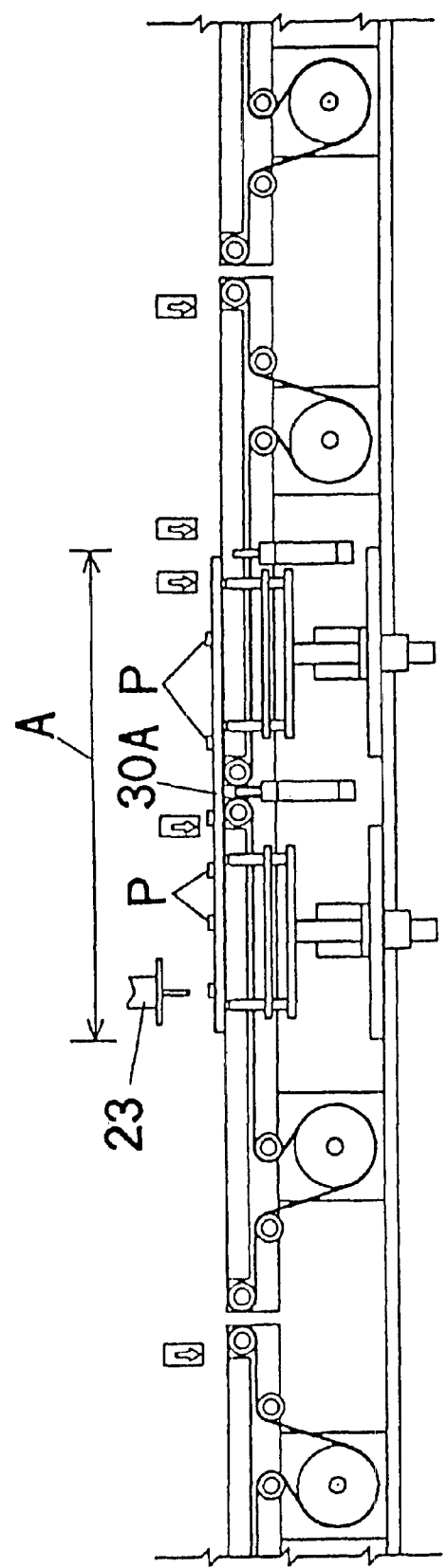
FIG. 3 is a side view of its operating state.

FIG. 2 shows a mode of mounting of electronic components on a first large substrate 30A. The mounting area A is set over the first conveyor 5 and second conveyor 6. The rod 11*a* of the first substrate stopper 11 and the rod 12*a* of the second substrate stopper 12 are set aside downward. The large substrate 30A is positioned over the first conveyor 5 and second conveyor 6. In this state, the transfer head 23, while moving horizontally in the X-direction or Y-direction, mounts electronic components P of the parts feeder 25 sequentially on positions of specified coordinates of the large substrate 30A. While mounting, the first substrate receiving means 15A and second substrate receiving means 15B both elevate to support the large substrate 30A from beneath by the pins 17. FIG. 3 shows the state of finishing the mounting of the electronic components P on the first large substrate 30A.

Figure 4:
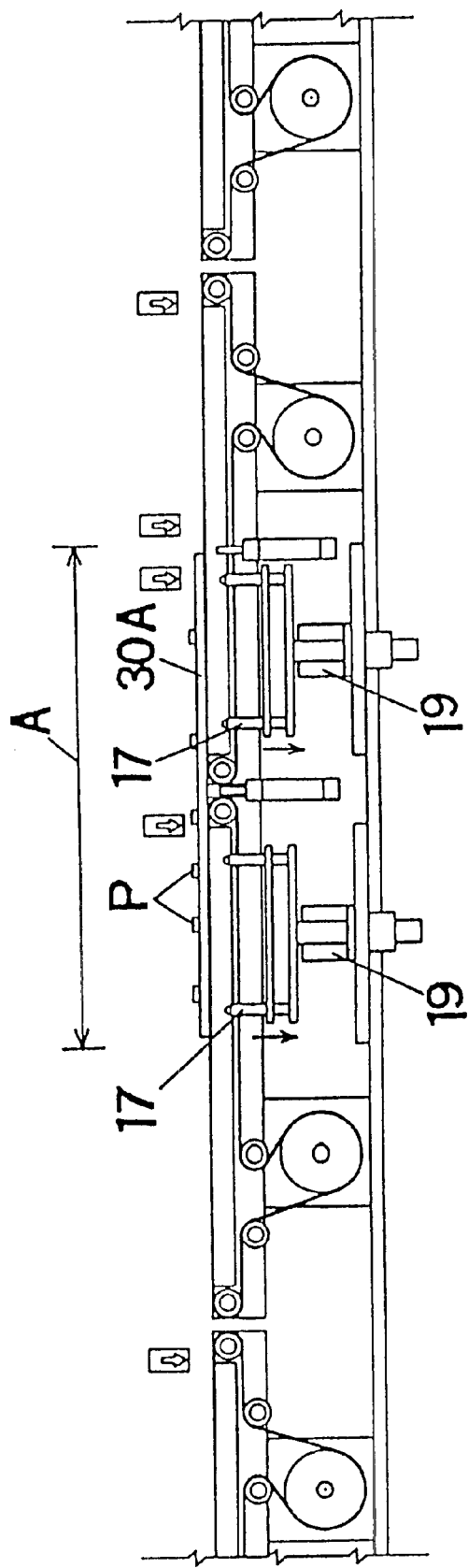
FIG. 4 is a side view of its operating state.

When finishing the mounting of the electronic components P on the large substrate 30A, as shown in FIG. 4, by lowering the pins 17 by driving the cylinders 19 of the first substrate receiving means 15A and second substrate receiving means 15B, the support state of the large substrate 30A is cleared. Consequently, as shown in FIG. 5, the large substrate 30A is discharged onto the discharge conveyor 7, and a second large substrate 30B is sent in from the delivery conveyor 4.

Figure 5:
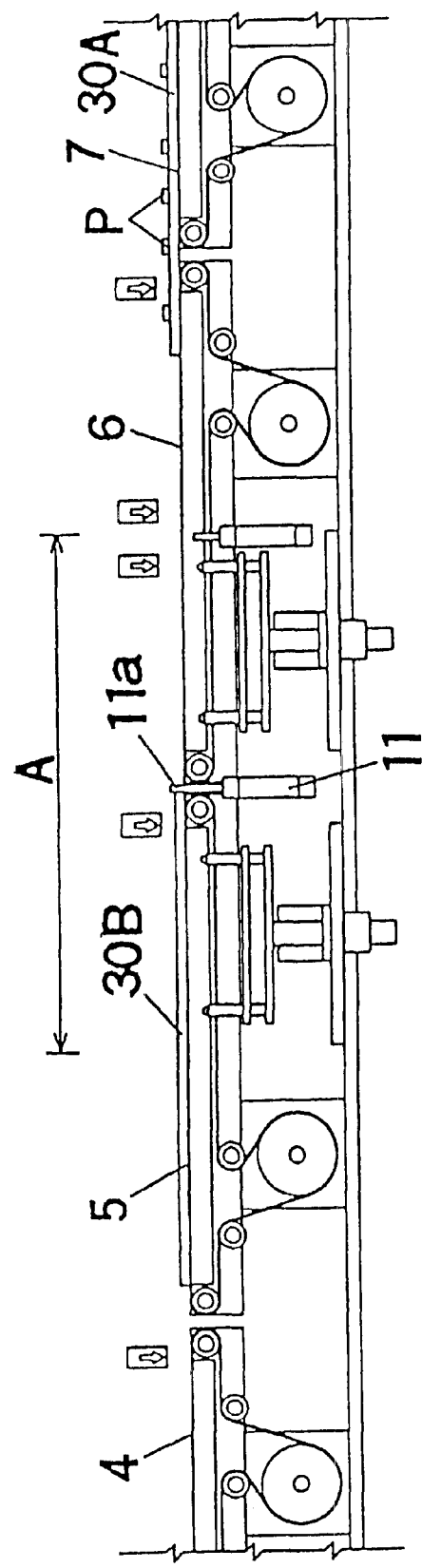
FIG. 5 is a side view of its operating state.
Figure 6:
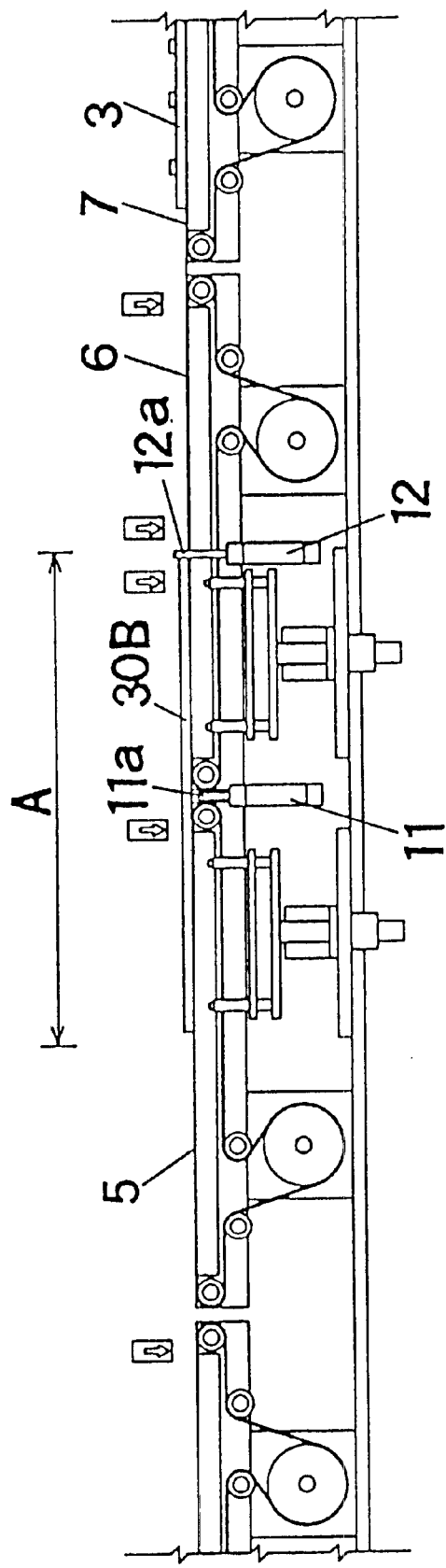
FIG. 6 is a side view of its operating state.
Figure 7:
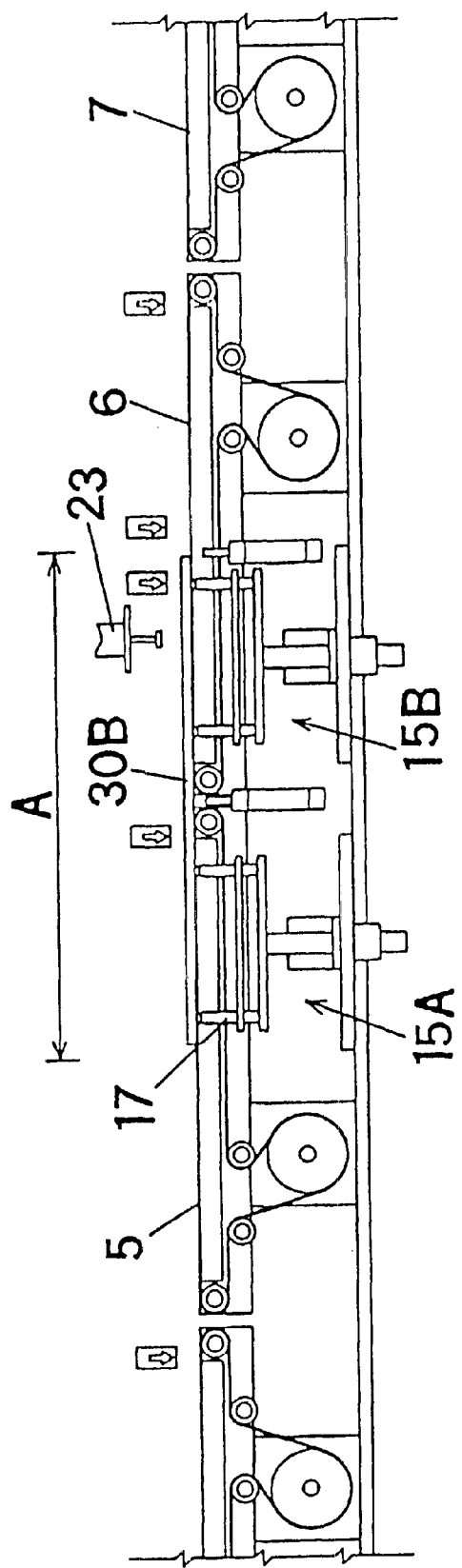
FIG. 7 is a side view of its operating state.

Herein, in a state in FIG. 5, discharge of the first large substrate 30A from the second conveyor 6 is not complete yet. In this state, therefore, the rod 11*a* of the first substrate stopper 11 is projected to the substrate conveying surface to prevent the second large substrate 30B from being delivered onto the second conveyor 6. Consequently, as shown in FIG. 6, when the large substrate 30A is discharged from the second conveyor 6 onto the discharge conveyor 7, the rod 11*a* of the first substrate stopper 11 is retracted, and the second large substrate 30B is delivered into the mounting area A. At this time, the rod 12*a* of the second cylinder 12 is projected to stop the large substrate 30B. Herein, the pins 17 of the first substrate receiving means 15A and the second substrate receiving means 15B are raised to support the second large substrate 30B from beneath, and mounting of electronic components P thereon is started (FIG. 7). Hereinafter, the same procedure as in the steps after FIG. 2 is repeated. The control of the conveyors 4 to 7 and substrate stoppers 11, 12 by controllers (not shown) is executed by substrate detection signals from the sensors S1 to S4.

Figure 8:
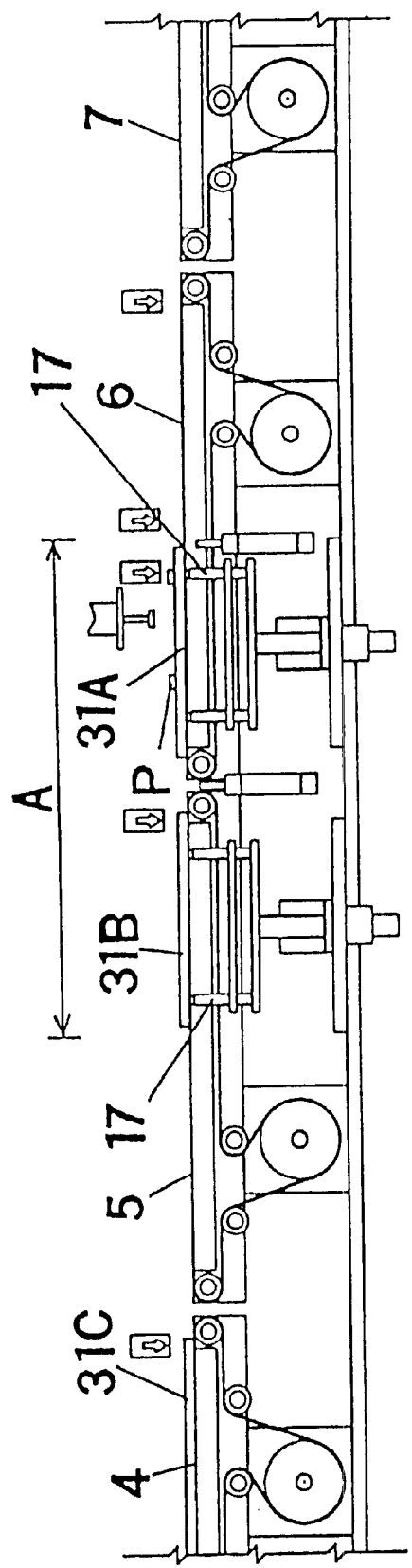
FIG. 8 is a side view of its operating state.

Referring next to FIG. 8 to FIG. 13, mounting of electronic components on small substrates is described below. The small substrates are identified as 31A, 31B, 31C in the sequence of mounting. In FIG. 8, the first small substrate 31A is present on the upstream side of the second conveyor 6, and the second small substrate 31B is on the downstream side of the first conveyor 5. These two small substrate 31A, 31B are both positioned in the mounting area A, but in this state the transfer head 23 mounts the electronic components P on the first small substrate 31A, and the second small substrate 31B waits for completion of mounting of electronic components P on the first small substrate 31A. That is, in the state in FIG. 8, the first conveyor 5 is in the waiting stage, and the second conveyor 6 is in the mounting stage. The third small substrate 31C is waiting on the delivery conveyor 4.

What is important in FIG. 8 is that the pins 17 of the first substrate receiving means 15A and second substrate receiving means 15B are both ascending and supporting the substrates 31A, 31B from beneath. That is, using the pins 17, by supporting not only the first small substrate 31A on the mounting stage (second conveyor 6) but also the second small substrate 31B on the waiting stage (first conveyor 5), if the mounting of electronic components P on the first small substrate 31A is suspended due to a shortage of electronic components P or the like, mounting of electronic components P on the small substrate 31B on the waiting stage (the waiting stage also exists in the mounting area A) can be immediately started.

Figure 9:
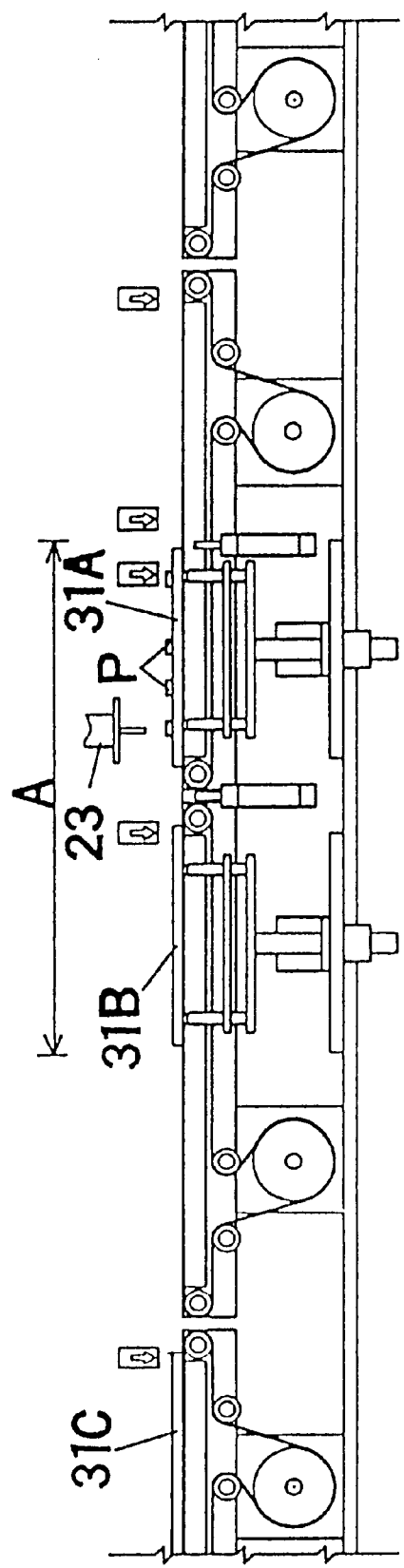
FIG. 9 is a side view of its operating state.
Figure 10:
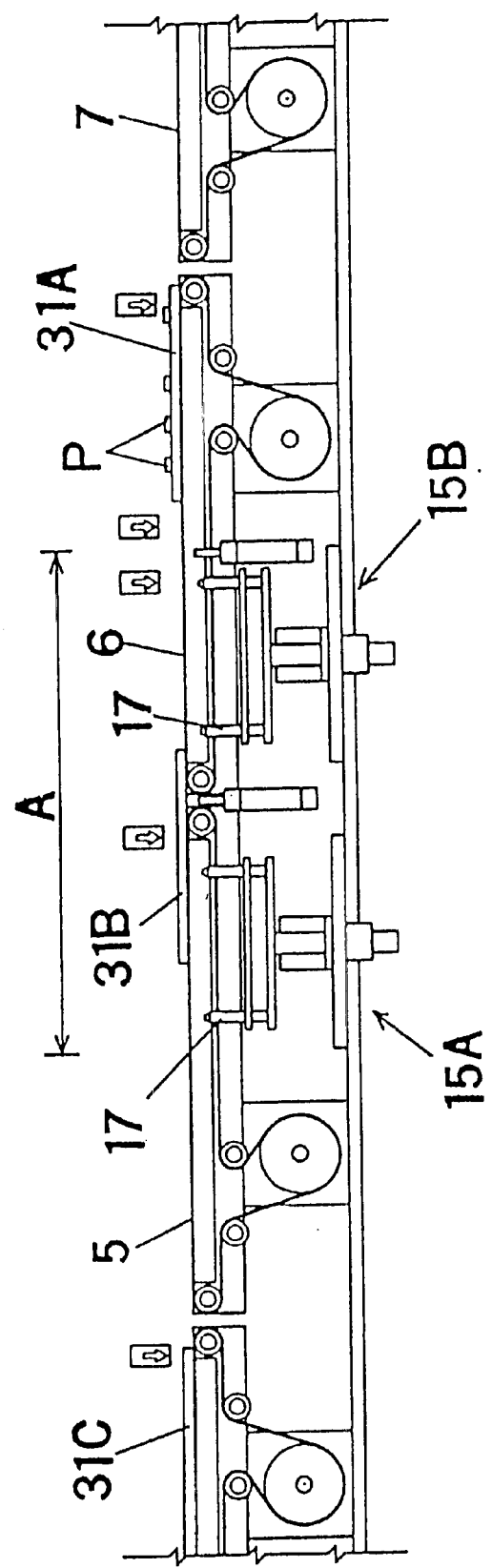
FIG. 10 is a side view of its operating state.
Figure 11:
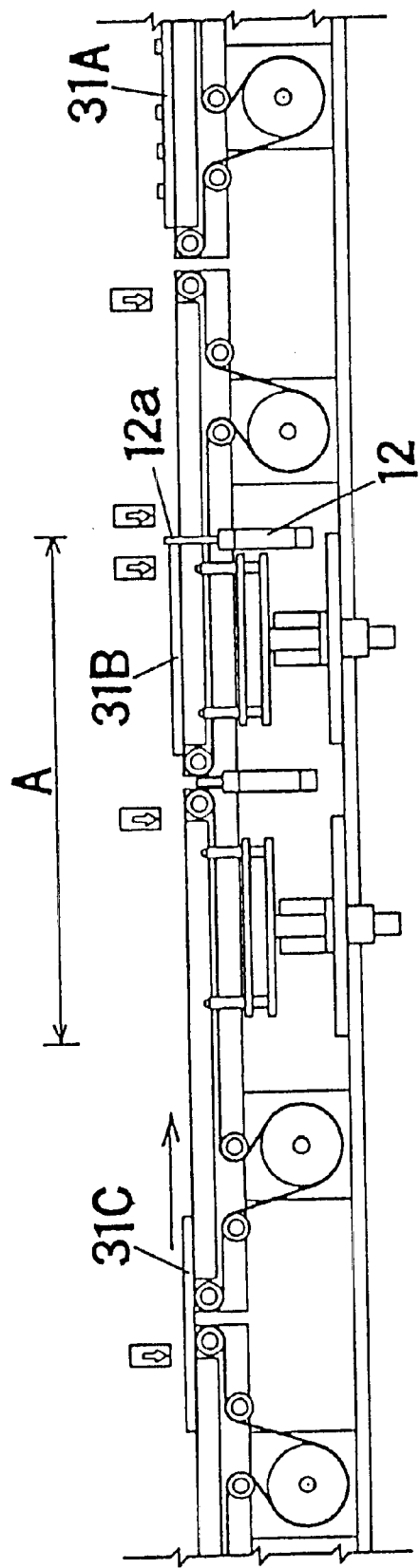
FIG. 11 is a side view of its operating state.

FIG. 9 shows a state of completion of mounting of electronic components P on the first small substrate 31A. Herein, as shown in FIG. 10, by lowering the pins 17 of the both substrate receiving means 15A, 15B, the first small substrate 31A is discharged onto the discharge conveyor 7, and the second small substrate 31B is delivered from the first conveyor 5 to the second conveyor 6. FIG. 11 shows the state of completion of discharge and delivery. In this case, the second small substrate 31B hits against the rod 12a of the second substrate stopper 12 and stops. In the mean time, delivery of the third small substrate 31C is started.

Figure 12:
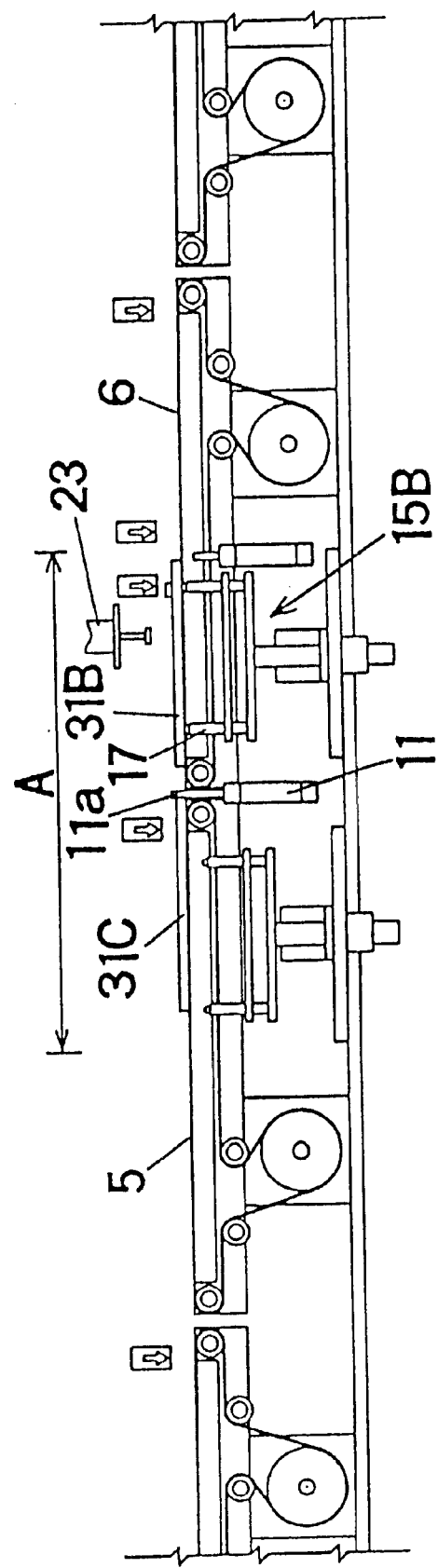
FIG. 12 is a side view of its operating state.
Figure 13:
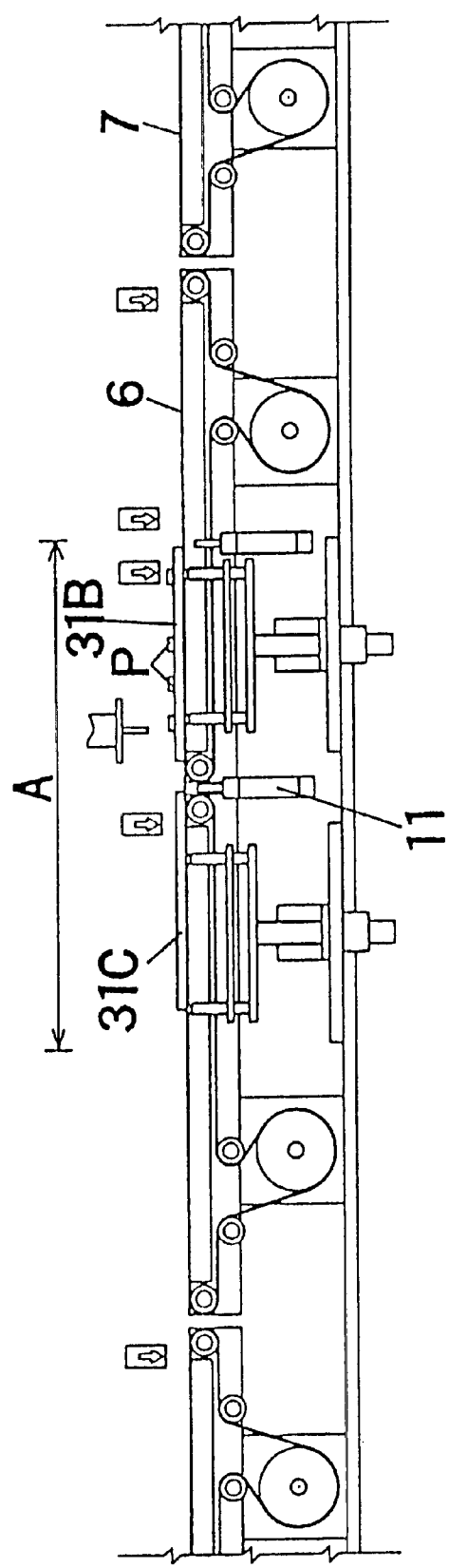
FIG. 13 is a side view of its operating state.

Consequently, as shown in FIG. 12, by raising the pin 17 of the second substrate receiving means 15B, mounting of electronic components P on the second small substrate 31B is started, and the third small substrate 31C is delivered onto the first conveyor 5 at the waiting stage, and is stopped at the first substrate stopper 11. Then, as shown in FIG. 13, mounting of electronic components P on the second small substrate 31B is terminated. By lowering the pin 17 of the substrate receiving means 15B, this small substrate 31B is discharged onto the discharge conveyor 7. The rod 11a of the first substrate stopper 11 is drawn back, and the pin 17 of the substrate receiving means 15A is lowered, so that the third small substrate 31C is delivered onto the second conveyor 6, thereby starting mounting of electronic components P on the third small substrate 31C.

Referring now to FIG. 14 to FIG. 19, in case any parts feeder 25 runs short of electronic components P in the midst of mounting on the small substrate by picking up electronic components P on the parts feeder 25 by the transfer head 23, the method of operation is described below.

Figure 14:
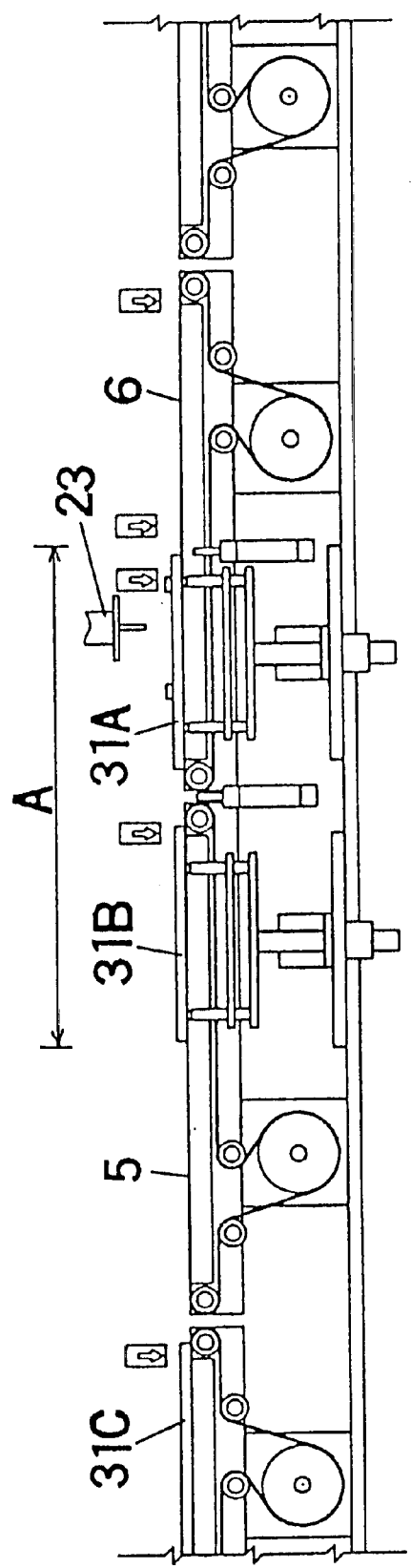
FIG. 14 is a side view of its operating state.
Figure 15:
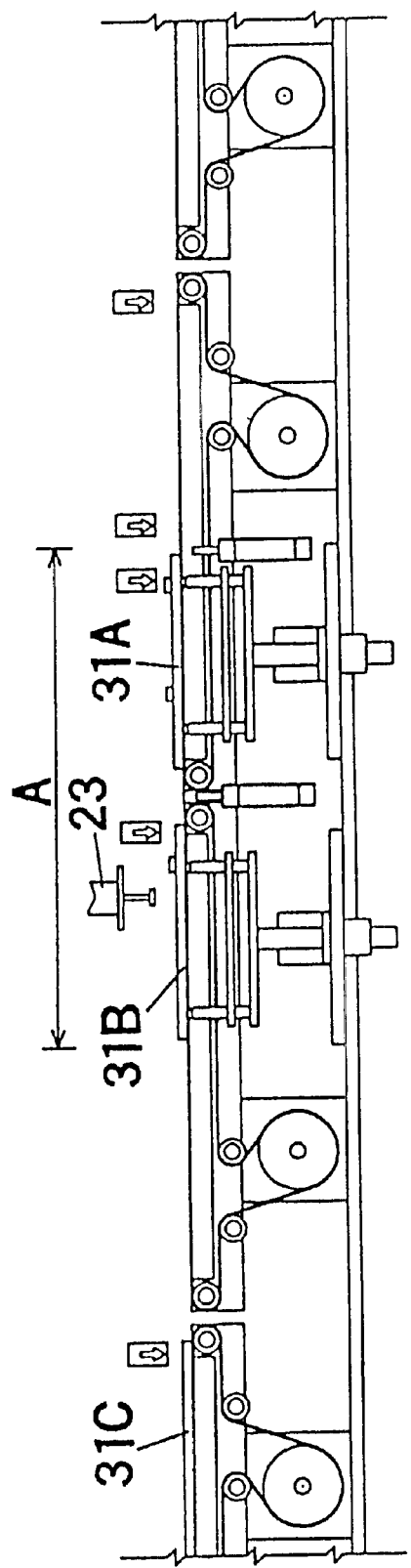
FIG. 15 is a side view of its operating state.

FIG. 14 shows a state of shortage of electronic components P during mounting of electronic components P on the first small substrate 31A on the second conveyor 6. At this time, the second small substrate 31B is waiting on the first conveyor 5 (waiting stage). In this case, the transfer head 23 suspends mounting of electronic components P on the first small substrate 31A, and starts mounting of electronic components P on the second small substrate 31B as shown in FIG. 15. Since this waiting state (on the first conveyor 5) is also within the mounting area A, such a change of mounting operation is possible. While mounting electronic components P on the second small substrate 31B, maintenance may be carried out, for example, the parts feeder 25 running out of electronic components P may be replaced, or electronic components P may be supplied into the parts feeder 25.

Figure 16:
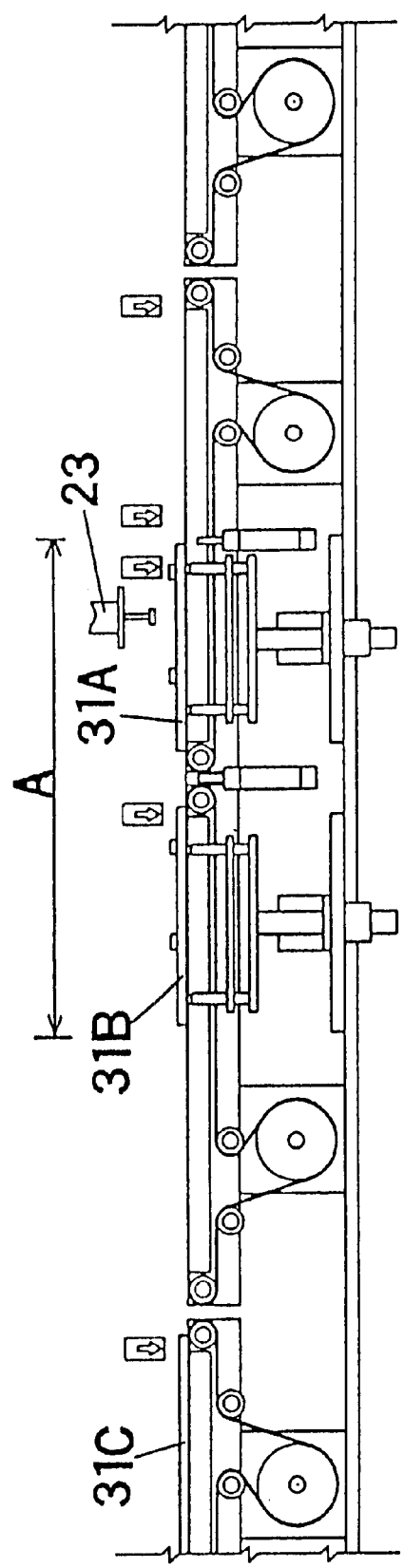
FIG. 16 is a side view of its operating state.

FIG. 16 shows a state of resuming mounting of electronic components P on the first small substrate 31A after replacement of the parts feeder 25 or refilling with electronic components P. In this mode, after completion of replacement of the parts feeder 25 or refilling with electronic components P, the transfer head 23 suspends mounting of electronic parts P on the second small substrate 31B, and resumes mounting of electronic components P on the first small substrate 31A. Alternatively, mounting of electronic components P on the first small substrate 31A may be resumed after completion of mounting of all electronic components P on the second small substrate 31B.

Figure 17:
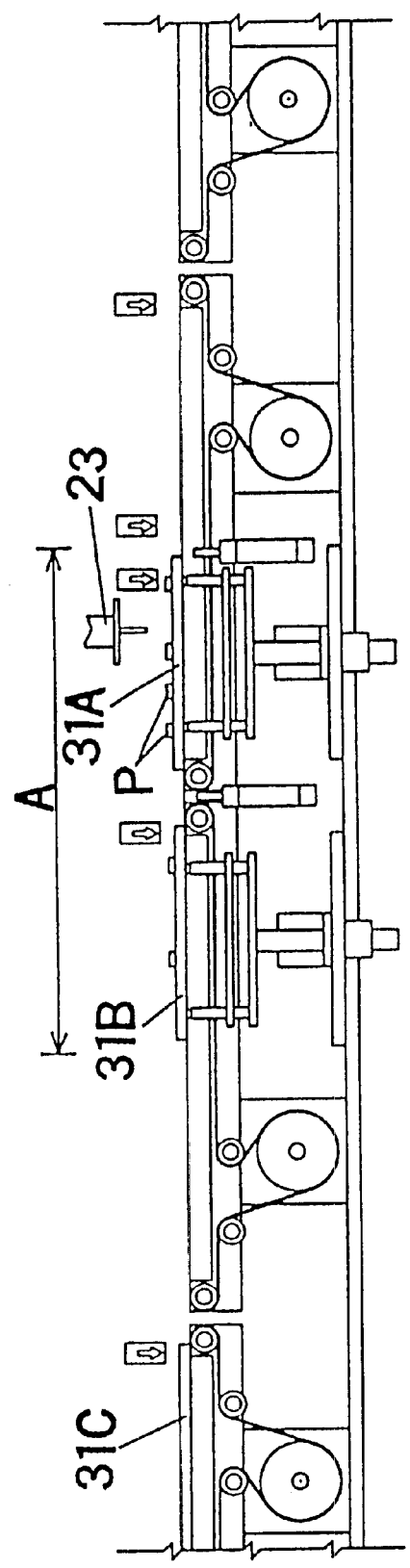
FIG. 17 is a side view of its operating state.
Figure 18:
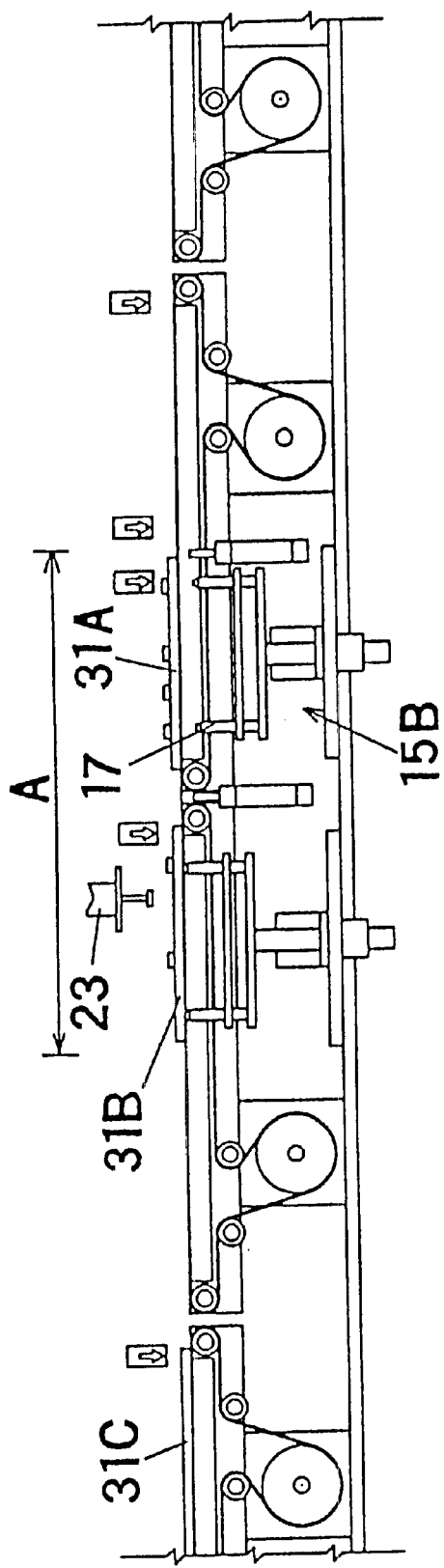
FIG. 18 is a side view of its operating state.
Figure 19:
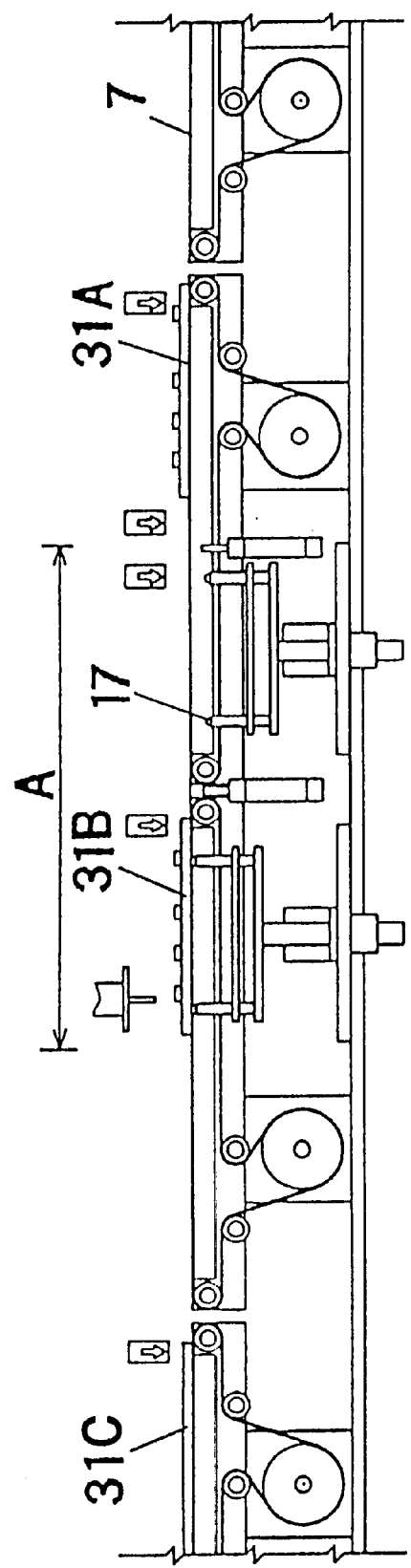
FIG. 19 is a side view of its operating state.

FIG. 17 shows a state of completion of mounting of electronic components P on the first small substrate 31A. Accordingly, as shown in FIG. 18, mounting of electronic components P on the second small substrate 31B on the waiting stage is resumed, and the pin 17 of the second substrate receiving means 15B is lowered, and the first small substrate 31A is discharged into the discharge conveyor 7 as shown in FIG. 19. In the mean time, mounting of electronic components P on the second small substrate 31B is terminated, and the second small substrate 31B is also discharged into the discharge conveyor 7. Successively, the third small substrate 31C and a fourth small substrate (not shown) are delivered onto the second conveyor 6 and first conveyor 5, and the operation returns to the state shown in FIG. 8.

According to the invention, as described herein, a plurality of conveyors are placed in a mounting area capable of mounting electronic components by a transfer head of electronic components. When mounting electronic components on a large substrate, the large substrate is positioned over the plurality of conveyors used as the mounting stage, and the electronic components are mounted by the transfer head. When mounting electronic component on small substrates, one single conveyor is used as the mounting stage for positioning the small substrate, and the electronic components are mounted by the transfer head, while another single conveyor is used as the waiting stage on which a next small substrate is waiting, so that the electronic components can be mounted by positioning the substrates efficiently depending on the size of substrates.

What is claimed is:

1. A method for mounting an electronic component on a substrate in a mounting area with a transfer head, wherein the mounting area contains a plurality of conveyers disposed independently of each other, said method comprising:

conveying substrates on the plurality of conveyers in the mounting area;

mounting at least one component on the substrate on one of the plurality of conveyers with the transfer head; and if said mounting of the at least one component is disabled due to a shortage of a component while mounting components on a substrate located on a downstream side conveyer of the plurality of conveyors, mounting at least one other component on another substrate located on the plurality of conveyers in the mounting area.

2. A method according to claim 1, further comprising replacing or replenishing the component in shortage while said mounting of the at least one other component on the another substrate occurs.

3. A method for mounting an electronic component on a substrate in a mounting area with a transfer head, wherein the mounting area contains a plurality of conveyers disposed independently of each other, said method comprising:

conveying at least one substrate on the plurality of conveyers in the mounting area;

if the at least one substrate is a large substrate, positioning the large substrate over the plurality of conveyers which are used as a mounting stage and mounting at least one component on the large substrate with the transfer head;

if the at least one substrate is a small substrate, positioning the small substrate on a downstream side conveyer of the plurality of conveyers, using an upstream side conveyer of the plurality of conveyers as a waiting stage on which another small substrate is waiting, and mounting at least one component on the small substrate on the downstream side conveyer which is used as a mounting stage with the transfer head; and when said mounting of the at least one component on the small substrate positioned on the downstream side conveyer is being performed, arresting delivery of the another small substrate located on the upstream side conveyer to the downstream side conveyer with a substrate stopper.

4. A method for mounting an electric component on a substrate in a mounting area with a transfer head, wherein the mounting area contains a plurality of conveyers disposed independently of each other, said method comprising:

conveying at least one substrate on the plurality of conveyers in the mounting area;

if the at least one substrate is a large substrate, positioning the large substrate over the plurality of conveyers which are used as a mounting stage and mounting at least one component on the large substrate with the transfer head; and if the at least one substrate is a small substrate, positioning the small substrate on a downstream side conveyer of the plurality of conveyers, using an upstream side conveyer of the plurality of conveyers as a waiting stage on which another small substrate is waiting, and mounting at least one component on the small substrate on the downstream side conveyer which is used as a mounting stage with the transfer head.

5. A method according to claim 4, further comprising if the at least one substrate is a large substrate, raising the large substrate with substrate receiving means disposed beneath the plurality of conveyers to support the large substrate from beneath during said mounting of the at least one component on the large substrate with the transfer head.

* * * * *